(12) United States Patent
Ohashi et al.

(10) Patent No.: US 11,600,488 B2
(45) Date of Patent: Mar. 7, 2023

(54) METHOD OF MANUFACTURING SEMICONDUCTOR DEVICE

(71) Applicant: KOKUSAI ELECTRIC CORPORATION, Tokyo (JP)

(72) Inventors: Naofumi Ohashi, Toyama (JP); Toshiyuki Kikuchi, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 444 days.

(21) Appl. No.: 16/810,496

(22) Filed: Mar. 5, 2020

(65) Prior Publication Data

US 2020/0286731 A1    Sep. 10, 2020

(30) Foreign Application Priority Data

Mar. 6, 2019    (JP) .............................. JP2019-040370

(51) Int. Cl.
*H01L 21/02* (2006.01)
*C23C 16/44* (2006.01)

(52) U.S. Cl.
CPC .... *H01L 21/02271* (2013.01); *C23C 16/4412* (2013.01); *H01L 21/02186* (2013.01)

(58) Field of Classification Search
CPC ......... H01L 21/02271; H01L 21/02186; H01L 21/67103; H01L 21/67167; H01L 21/67248; H01L 21/67742; H01L 21/67745; H01L 21/67754; H01L 21/68742; H01L 21/68792; H01L 21/67023; H01L 21/67276; H01L 21/02172; H01L 21/67748; C23C 16/4412; C23C 16/54; C23C 16/46
See application file for complete search history.

(56) References Cited

U.S. PATENT DOCUMENTS

| | | | |
|---|---|---|---|
| 6,187,691 B1 | 2/2001 | Fukuda et al. | |
| 9,589,819 B1* | 3/2017 | Takano | ............ H01L 21/67248 |
| 2016/0064219 A1 | 3/2016 | Yamamoto et al. | |

FOREIGN PATENT DOCUMENTS

| | | |
|---|---|---|
| JP | 11-340215 A | 12/1999 |
| JP | 2000-323468 A | 11/2000 |
| JP | 2002-129336 A | 5/2002 |
| JP | 2012-054399 A | 3/2012 |

(Continued)

OTHER PUBLICATIONS

The machine translation of JP 2011-253973. (Year: 2011).*

(Continued)

*Primary Examiner* — Yasser A Abdelaziez
(74) *Attorney, Agent, or Firm* — Volpe Koenig (57) ABSTRACT

There is provided a technique that includes: loading an m-th substrate into a process chamber, wherein m is an integer less than n; forming a film on the m-th substrate by heating the m-th substrate in the process chamber; unloading the m-th substrate from the process chamber; waiting for a predetermined time in the process chamber, in a state where the substrates are not present in the process chamber, after the act of unloading; loading a next substrate, which is one of the n substrates to be processed next, into the process chamber, after the act of waiting; and forming a film on the next substrate by heating the next substrate in the process chamber.

17 Claims, 10 Drawing Sheets

(56) References Cited

FOREIGN PATENT DOCUMENTS

| | | |
|---|---|---|
| KR | 10-1751599 B1 | 6/2017 |
| TW | 201214606 A | 4/2012 |

OTHER PUBLICATIONS

Taiwanese Office Action dated Sep. 3, 2020 for Taiwanese Patent Application No. 108143383.
Japanese Office Action dated Nov. 10, 2020 for Japanese Patent Application No. 2019-040370.
Korean Office Action dated May 21, 2021 for Korean Patent Application No. 10-2020-0027018.

* cited by examiner

METHOD OF MANUFACTURING SEMICONDUCTOR DEVICE

CROSS-REFERENCE TO RELATED APPLICATION

This application is based upon and claims the benefit of priority from Japanese Patent Application No. 2019-040370, filed on Mar. 6, 2019, the entire contents of which are incorporated herein by reference.

TECHNICAL FIELD

The present disclosure relates to a method of manufacturing a semiconductor device, a substrate processing apparatus, and a program.

BACKGROUND

As an apparatus for manufacturing a semiconductor device, there is a single-wafer apparatus that processes substrates one by one. In the single-wafer apparatus, for example, a substrate is heated and a gas is supplied to the substrate to form a film configured as a part of the semiconductor device.

When the same type of film is formed on a plurality of substrates, it is desirable to suppress variations in process conditions between the substrates. The process condition is, for example, the heating temperature of the substrates.

In the cases where the plurality of substrates is successively heated by the single-wafer apparatus, the temperature of a process chamber may increase in accordance with the number of substrates continuously processed. In some films, when a predetermined temperature is increased, since a film quality of the film is changed, there is a possibility that a film having a desired quality may not be formed on the substrates.

SUMMARY

Some embodiments of the present disclosure provide a technique for forming a film having a desired quality in a substrate processing apparatus which continuously heats a plurality of substrates.

According to one or more embodiments of the present disclosure, there is provided a technique that includes: loading an m-th substrate into a process chamber, wherein m is an integer less than n; forming a film on the m-th substrate by heating the m-th substrate in the process chamber; unloading the m-th substrate from the process chamber; waiting for a predetermined time in the process chamber, in a state where the substrates are not present in the process chamber, after the act of unloading; loading a next substrate, which is one of the n substrates to be processed next, into the process chamber, after the act of waiting; and forming a film on the next substrate by heating the next substrate in the process chamber.

DETAILED DESCRIPTION

Embodiments will now be described with reference to the drawings.

(1) Configuration of Substrate Processing Apparatus

Figure 1:
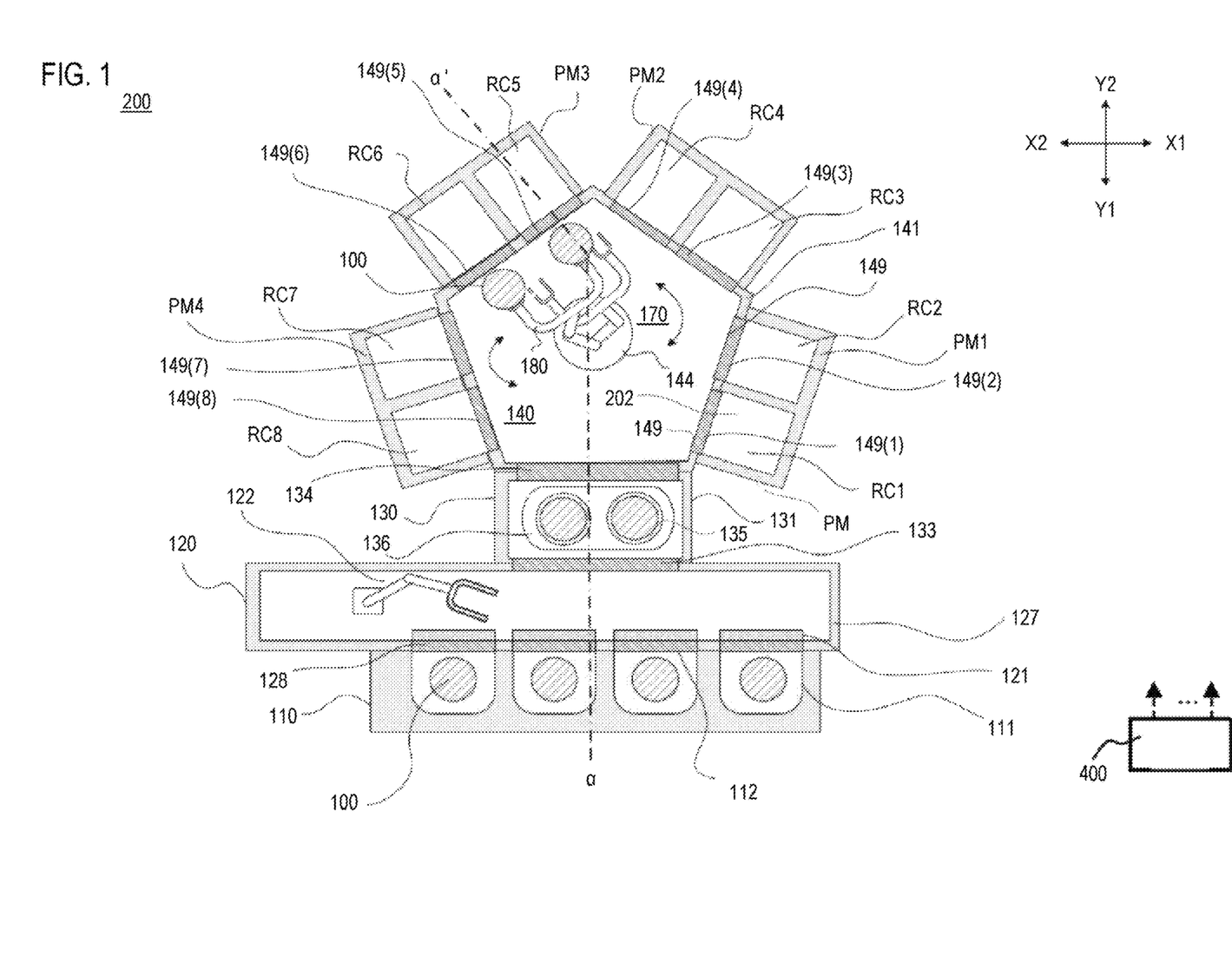
FIG. 1 is an explanatory view for explaining a substrate processing apparatus according to one or more embodiments.
Figure 2:
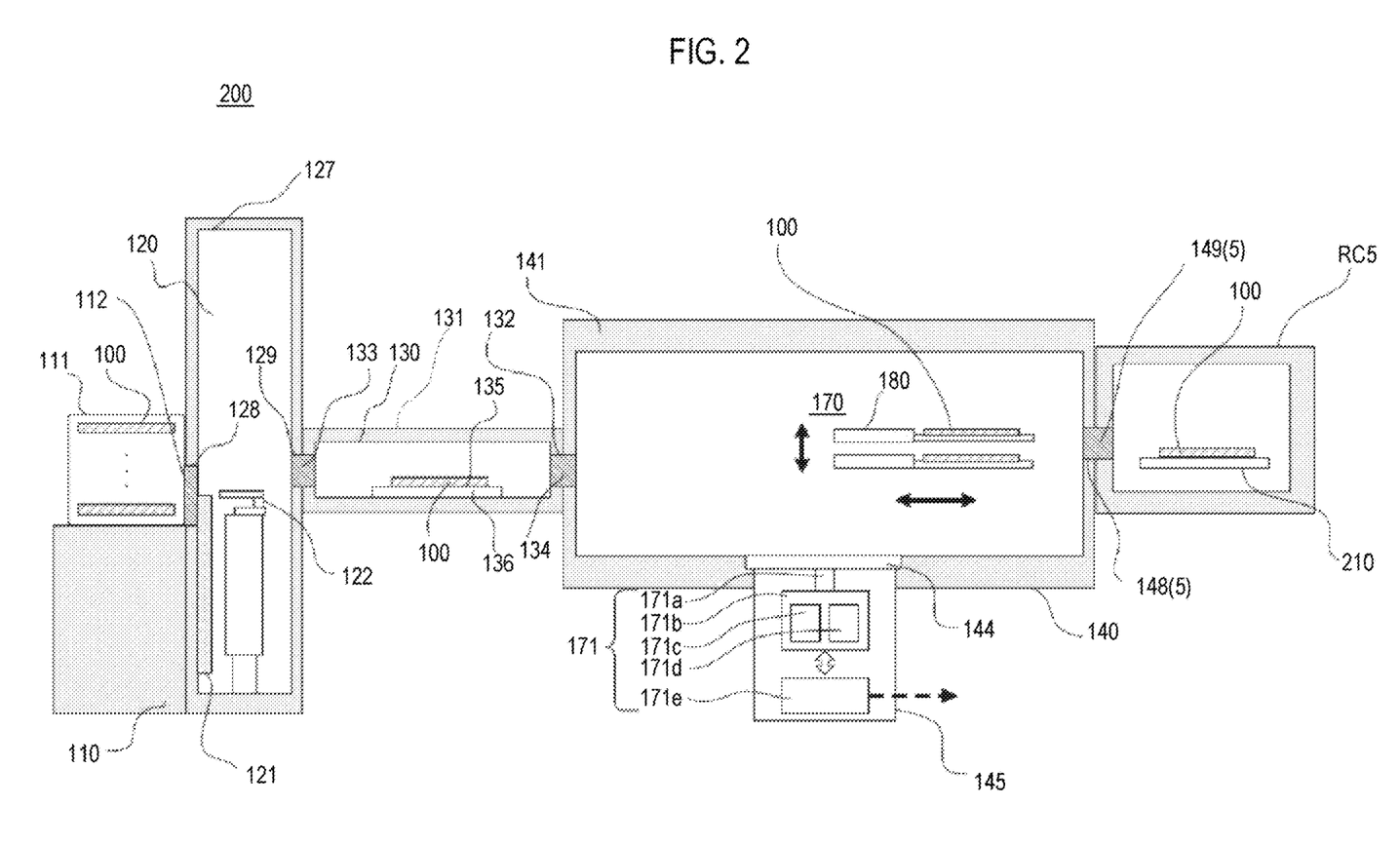
FIG. 2 is an explanatory view for explaining a substrate processing apparatus according to one or more embodiments.
Figure 5:
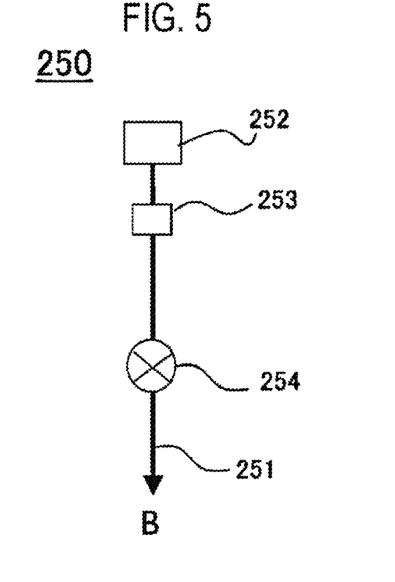
FIG. 5 is an explanatory view for explaining a gas supplier according to one or more embodiments.
Figure 6:
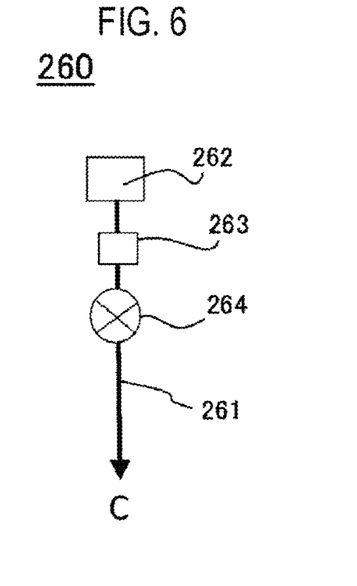
FIG. 6 is an explanatory view for explaining a gas supplier according to one or more embodiments.
Figure 7:
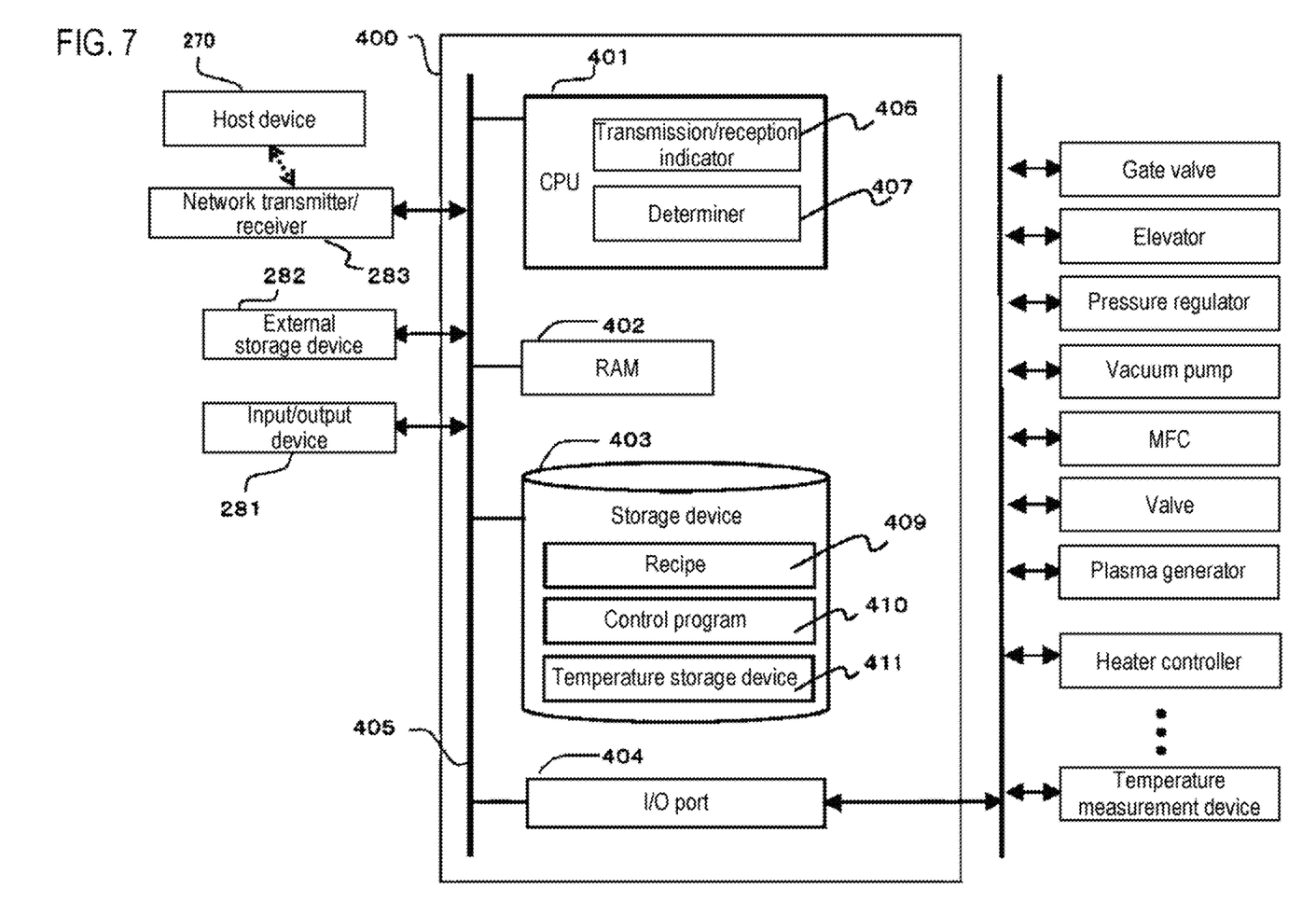
FIG. 7 is an explanatory view for explaining a controller of the substrate processing apparatus according to one or more embodiments.

The configurations of a substrate processing apparatus will be described with reference to FIGS. 1 to 7. FIGS. 1 and 2 are explanatory views for explaining an overview of the substrate processing apparatus, and FIGS. 3 to 6 are explanatory views for explaining a process module of the substrate processing apparatus. FIG. 7 is an explanatory view for explaining a controller of the substrate processing apparatus. Hereinafter, each configuration will be specifically described.

The schematic configuration of the substrate processing apparatus will be described with reference to FIGS. 1 and 2. FIG. 1 is a cross-sectional view illustrating a configuration example of the substrate processing apparatus. FIG. 2 is a longitudinal sectional view taken along line α-α' in FIG. 1.

A substrate processing apparatus 200 is to process a substrate 100 and mainly includes an IO stage 110, an atmosphere transfer chamber 120, a load lock chamber 130, a vacuum transfer chamber 140, and a module PM. Next, each configuration will be described in detail. In descriptions of FIG. 1, a right direction corresponds to an X1 direction, a left direction corresponds to an X2 direction, a front direction corresponds to an Y1 direction, and a rear direction corresponds to an Y2 direction.

(Atmosphere Transfer Chamber and IO Stage)

The IO stage (load port) 110 is installed at a front side of the substrate processing apparatus 200. A plurality of pods 111 is mounted on the IO stage 110. Each pod 111 is used as a carrier for transferring a substrate 100 such as a silicon (Si) substrate.

A plurality of substrates 100, for example, n substrates 100, managed as a lot are stored in the pod 111.

A cap 112 is installed at the pod 111 and is opened/closed by a pod opener 121. The pod opener 121 opens/closes the cap 112 of the pod 111 mounted at the IO stage 110 and opens/closes a substrate entrance to enable loading/unloading of the substrate 100 in/from the pod 111. The pod 111 is supplied/discharged to/from the IO stage 110 by an AMHS (Automated Material Handling Systems, which is an automatic wafer transfer system) (not shown).

The IO stage 110 is adjacent to the atmosphere transfer chamber 120. The atmosphere transfer chamber 120 is connected to the load lock chamber 130 (which will be described later) at its surface opposite to the IO stage 110. An atmosphere transfer robot 122 for transferring the substrate 100 is installed in the atmosphere transfer chamber 120.

A substrate loading/unloading port 128 for loading/unloading the substrate 100 into/from the atmosphere transfer chamber 120, and the pod opener 121 are installed at a front side of a housing 127 of the atmosphere transfer chamber 120. A substrate loading/unloading port 129 for loading/unloading the substrate 100 into/from the load lock chamber 130 is installed at a rear side of the housing 127 of the atmosphere transfer chamber 120. The substrate loading/unloading port 129 enables loading/unloading of the substrate 100 by being opened/closed by a gate valve 133.

(Load Lock Chamber)

The load lock chamber 130 is adjacent to the atmosphere transfer chamber 120. The vacuum transfer chamber 140, which will be described later, is disposed at a surface, which is opposite to the atmosphere transfer chamber 120, among surfaces of a housing 131 forming the load lock chamber 130.

A substrate-mounting table 136 including at least two mounting surfaces 135, on which the substrate 100 is to be mounted, is installed in the load lock chamber 130. A distance between the substrate-mounting surfaces 135 is set according to a distance between end effectors of arms of a robot 170 to be described later.

(Vacuum Transfer Chamber)

The substrate processing apparatus 200 includes the vacuum transfer chamber (transfer module) 140 as a transfer chamber which is a transfer space into which the substrate 100 is transferred under a negative pressure. A housing 141 forming the vacuum transfer chamber 140 is formed to have a pentagon shape in a plan view, and the load lock chamber 130 and modules PM (PM1 to PM4) for processing the substrate 100 are connected to sides of the pentagon, respectively. The transfer robot 170 as a transfer device for transferring the substrate 100 under a negative pressure is installed at approximately the center of the vacuum transfer chamber 140 with a flange 144 as a base of the transfer robot 170.

The vacuum transfer robot 170 installed in the vacuum transfer chamber 140 is configured to move up or down while maintaining airtightness of the vacuum transfer chamber 140 by an elevator 145 and the flange 144. Two arms 180 of the robot 170 are configured to be able to move up or down. In FIG. 2, for the sake of convenience of description, the end effectors of the arms 180 are shown, and a link structure or the like between the end effectors and the flange 144 are omitted.

A reactor (hereinafter, referred to as RC) is installed at each of PM1, PM2, PM3, and PM4. Specifically, RC1 and RC2 are installed at the PM1. RC3 and RC4 are installed at the PM2. RC5 and RC6 are installed at the PM3. RC7 and RC8 are installed at the PM4.

A partition wall is installed between the two RCs installed in each PM so that the atmospheres of process spaces 205 to be described later are not mixed, i.e., the process spaces 205 have independent atmospheres.

A substrate loading/unloading port 148 is installed at each of the side walls of the housing 141 facing the respective RCs. For example, as illustrated in FIG. 2, a substrate loading/unloading port 148(5) is installed at a side wall facing the RC5. Further, a gate valve 149 is installed for each RC. For example, a gate valve 149(5) is installed for the RC5. Since the RC1 to RC4 and RC6 to RC8 have similar configuration as the RC5, explanation thereof is omitted.

An arm controller 171 that controls the moving up/down or rotation of the arm 180 is incorporated in the elevator 145. The arm controller 171 mainly includes a support shaft 171a that supports an axis of the arm 180, and an actuator 171b that moves up/down or rotates the support shaft 171a. A hole is formed in the flange 144 between the axis of the arm 180 and the support shaft 171a, and the support shaft 171a is configured to directly support the axis of the arm 180.

The actuator 171b includes, for example, an elevator mechanism 171c including a motor for realizing the moving up/down, and a rotation mechanism 171d such as a gear for rotating the support shaft 171a. In addition, as a part of the arm controller 171, an indicator 171e for instructing the actuator 171b for moving up/down and rotation may be installed in the elevator 145. The indicator 171e is electrically connected to a controller 400. The indicator 171e controls the actuator 171b based on an instruction from the controller 400.

The arm 180 can rotate and extend with respect to its axis. The rotation and extension is performed to load/unload the substrate 100 into/from the RC. Further, according to an instruction from the controller 400, a wafer can be transferred to an RC corresponding to a wafer number.

(Module)

Next, the modules (PM) will be described focusing on a reactor (RC). Since PM1 to PM4 have similar configuration, they will be described here as PM. Further, since RC1 to RC8 have similar configuration, they will be described here as RC.

As illustrated in FIG. 1, the PM has two RCs. As will be described later, a gas supplier and a gas exhauster are connected to each RC. In the present embodiments, the RC, the gas supplier, and the gas exhauster are collectively referred to as a PM.

Figure 3:
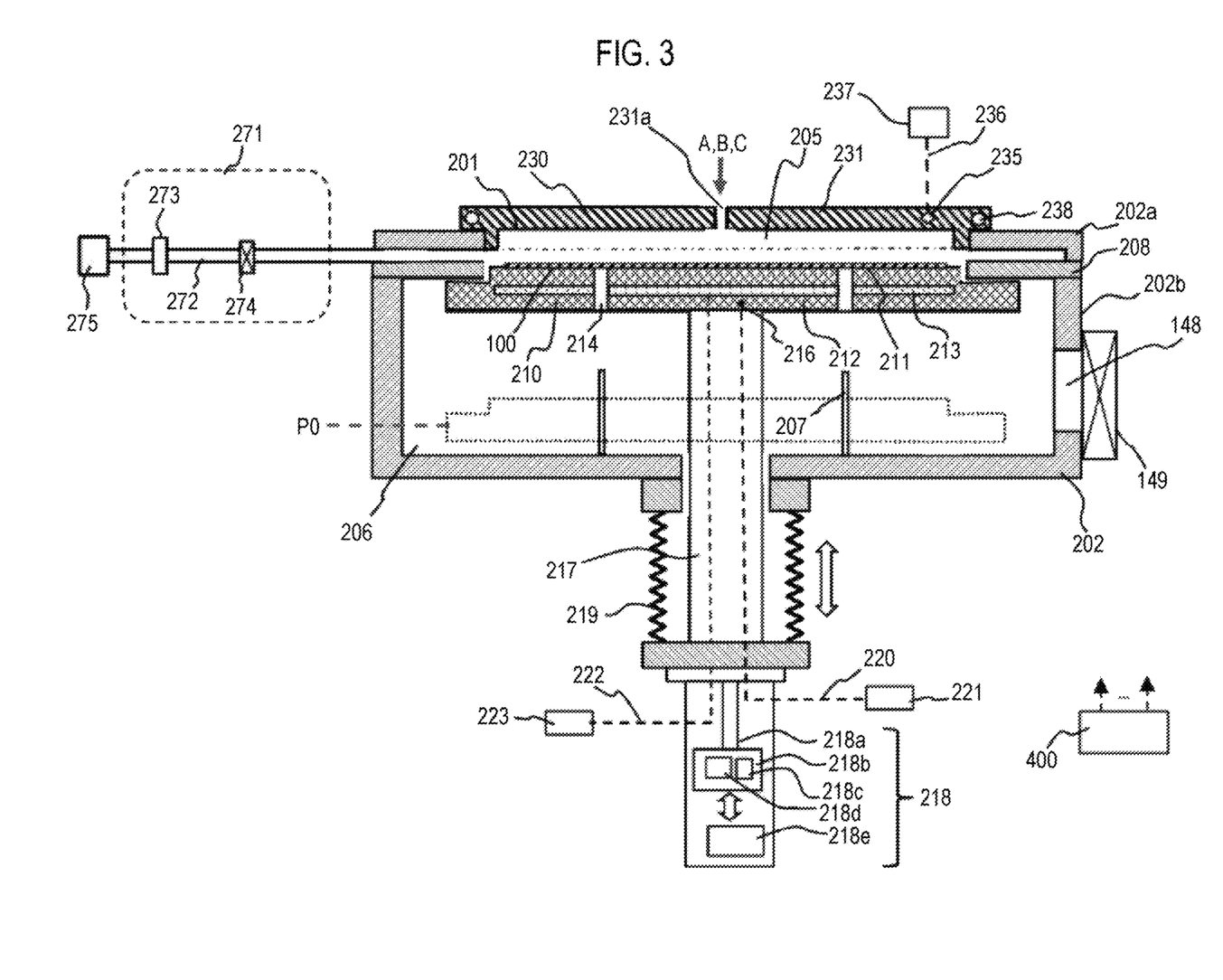
FIG. 3 is an explanatory view for explaining a module according to one or more embodiments.

An RC will be described in detail with reference to FIG. 3. In addition, since the adjacent RCs have similar configuration, only one RC will be described here. As illustrated in FIG. 3, the RC includes a container 202. The container 202 is configured as, for example, a flat sealed container having a circular cross section. The container 202 includes, for example, a metal material such as aluminum (Al), stainless steel (SUS), or the like. In the container 202, there are formed a process chamber 201 constituting a process space 205 for processing a substrate 100 such as a silicon wafer or the like, and a transfer chamber 206 including a transfer space through which the substrate 100 passes when transferring the substrate 100 to the process space 205. The container 202 includes an upper container 202a and a lower container 202b. A partition plate 208 is interposed between the upper container 202a and the lower container 202b.

The substrate loading/unloading port 148 adjacent to the gate valve 149 is installed at a side surface of the lower container 202b, and the substrate 100 is moved between the vacuum transfer chamber 140 and the lower container 202b via the substrate loading/unloading port 148. A plurality of lift pins 207 are installed at a bottom of the lower container 202b. Further, the lower container 202b is grounded.

A substrate support 210 for supporting the substrate 100 is disposed in the process space 205. The substrate support 210 mainly includes a substrate-mounting surface 211 on which the substrate 100 is mounted, a substrate-mounting table 212 having the substrate-mounting surface 211 on its surface, and a heater 213 as a heating part installed in the substrate-mounting table 212. In the substrate-mounting table 212, through-holes 214 through which the lift pins 207 pass are formed at positions corresponding to the lift pins 207, respectively.

The substrate-mounting table 212 includes a temperature measuring device 216 which is a first temperature measuring device for measuring a temperature of the heater 213. The temperature measuring device 216 is connected to a temperature measurement device 221, which is a first temperature measurement device, via a wiring 220.

A wiring 222 for supplying power is connected to the heater 213. The wiring 222 is connected to a heater controller 223.

The temperature measurement device 221 and the heater controller 223 are electrically connected to the controller 400 to be described later. The controller 400 transmits control information to the heater controller 223 based on temperature information measured by the temperature measurement device 221. The heater controller 223 refers to the received control information to control the heater 213.

The substrate-mounting table 212 is supported by a shaft 217. The shaft 217 passes through the bottom of the container 202 and is connected to an elevator 218 outside the container 202.

The elevator 218 mainly includes a support shaft 218a that supports the shaft 217, and an actuator 218b that moves up/down or rotates the support shaft 218a. The actuator 218b has, for example, an elevator mechanism 218c including a motor for implementing the moving up/down, and a rotation mechanism 218d such as a gear for rotating the support shaft 218a.

An indicator 218e for instructing the actuator 218b for moving up/down and rotating may be installed at the elevator 218, as a part of the elevator 218. The indicator 218e is electrically connected to the controller 400. The indicator 218e controls the actuator 218b based on an instruction from the controller 400.

By actuating the elevator 218 to move the shaft 217 and the substrate-mounting table 212 up/down, the substrate-mounting table 212 can move the substrate 100 up/down mounted on the mounting surface 211. A periphery of a lower end portion of the shaft 217 is covered by a bellows 219, whereby an interior of the process space 205 is kept hermetically sealed.

The process chamber 201 includes, for example, a buffer structure 230 to be described later, and the substrate-mounting table 212. The process chamber 201 may include another structure as long as the process space 205 can be secured for processing the substrate 100.

When transferring the substrate 100, the substrate-mounting table 212 moves down to a transfer position P0 at which the substrate-mounting surface 211 faces the substrate loading/unloading port 148. When processing the substrate 100, the substrate-mounting table 212 moves up until the substrate 100 reaches a processing position in the process space 205, as illustrated in FIG. 3.

The buffer structure 230 for gas diffusion is installed above the process space 205 (upstream side). The buffer structure 230 includes a lid 231.

A temperature measuring device 235 is installed at the lid 231. The temperature measuring device 235 is connected to a temperature measurement device 237, which is a second temperature measurement device, via a wiring 236. The temperature measuring device 235 detects a temperature of the process chamber 201.

The lid 231 communicates with a first gas supplier 240, a second gas supplier 250, and a third gas supplier 260, which will be described later, so as to communicate with gas introduction holes 231a formed at the lid 231. Although only one gas introduction hole 231a is shown in FIG. 3, a gas introduction hole may be installed for each gas supplier.

A cooler 238 for cooling the process chamber 201 may be installed at the lid 231. For example, a coolant is supplied to the cooler 238. The coolant acts to prevent the temperature of the buffer structure 230 from being excessively increased in a film-forming S106 to be described later and to cool the process chamber 201 in a waiting S120 to be described later.

(First Gas Supplier)

Figure 4:
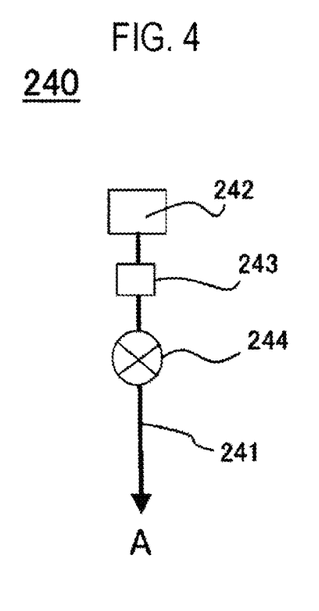
FIG. 4 is an explanatory view for explaining a gas supplier according to one or more embodiments.

Next, the first gas supplier 240 will be described with reference to FIG. 4. The first gas supplier 240 includes a first gas supply pipe 241. The first gas supply pipe 241 corresponds to A in FIG. 3 and is configured to supply gas into the process chamber 201.

A first gas source 242, a mass flow controller (MFC) 243, which is a flow rate controller (flow rate control part), and a valve 244, which is an opening/closing valve, are installed at the first gas supply pipe 241, in this order from an upstream side.

The first gas source 242 is a source of a first gas containing a first element (also referred to as a "first element-containing gas"). The first element-containing gas is a precursor gas, that is, one of the process gases. Here, the first element is, for example, titanium (Ti). That is, the first element-containing gas is, for example, a titanium-containing gas. Specifically, titanium tetrachloride ($TiCl_4$) gas is used as the titanium-containing gas.

The first gas supplier 240 (also referred to as a titanium-containing gas supply system) mainly includes the first gas supply pipe 241, the mass flow controller 243, and the valve 244.

(Second Gas Supplier)

Next, the second gas supplier 250 will be described with reference to FIG. 5. The second gas supplier 250 includes a second gas supply pipe 251. The second gas supply pipe 251 corresponds to B in FIG. 3 and is configured to supply gas into the process chamber 201.

A second gas source 252, a mass flow controller (MFC) 253, which is a flow rate controller (flow rate control part), and a valve 254, which is an opening/closing valve are installed at the second gas supply pipe 251, in this order from an upstream side.

The second gas source 252 is a source of a second gas containing a second element (also referred to as a "second element-containing gas"). The second element-containing gas is one of the process gases. The second element-containing gas may be considered as a reaction gas or a modifying gas.

Here, the second element-containing gas contains the second element different from the first element. The second element is, for example, any one of oxygen (O), nitrogen (N), and carbon (C). Here, the second element-containing gas may be described as, for example, a nitrogen-containing gas. Specifically, ammonia gas ($NH_3$) is used as the nitrogen-containing gas.

The second gas supplier 250 (also referred to as a reaction gas supply system) mainly includes the second gas supply pipe 251, the mass flow controller 253, and the valve 254.

If a film is formed on the substrate 100 by the first gas alone, the second gas supplier 250 may be excluded.

(Third Gas Supplier)

Next, the third gas supplier 260 will be described with reference to FIG. 6. The third gas supplier 260 includes a third gas supply pipe 261. The third gas supply pipe 261 corresponds to C in FIG. 3 and is configured to supply gas into the process chamber 201.

A third gas source 262, a mass flow controller (MFC) 263, which is a flow rate controller (flow rate control part), and a valve 264, which is an opening/closing valve are installed at the third gas supply pipe 251, in this order from an upstream side.

The third gas source 262 is a cooling gas source. The cooling gas is a heat conductive gas that cools the container 202, and is, for example, nitrogen ($N_2$) gas or argon (Ar) gas.

The third gas supplier 260 mainly includes the third gas supply pipe 261, the mass flow controller 263, and the valve 264.

The first gas supplier 240, the second gas supplier 250, and the third gas supplier 260 described above are collectively called a gas supplier.

(Exhauster)

Subsequently, an exhauster 271 will be described with reference to FIG. 3. An exhaust pipe 272 communicates to the process space 205. The exhaust pipe 272 is connected to the upper container 202a so as to communicate to the process space 205. An APC (Auto Pressure Controller) 273 which is a pressure controller that controls the interior of the process space 205 to a predetermined pressure is installed at the exhaust pipe 272. The APC 273 includes a valve body (not shown) whose opening degree can be adjusted, and adjusts a conductance of the exhaust pipe 272 according to an instruction from the controller 400. Further, a valve 274 is installed at the exhaust pipe 272 in an upstream side of the APC 273. The exhaust pipe 272, the valve 274, and the APC 273 are collectively referred to as an exhauster.

Furthermore, a DP (Dry Pump) 275 is installed at a downstream side of the exhaust pipe 272. The DP 275 exhausts an atmosphere of the process space 205 through the exhaust pipe 272.

(Controller)

Next, the controller 400 will be described with reference to FIG. 7. The substrate processing apparatus 200 includes the controller 400 that controls operations of various components.

The controller 400, which is a control part (control means), is configured as a computer including a central processing unit (CPU) 401, a random access memory (RAM) 402, a storage device 403 as a memory device, and an I/O port 404. The RAM 402, the storage device 403, and the I/O port 404 are configured to be able to exchange data with the CPU 401 via an internal bus 405. Transmission/reception of data in the substrate processing apparatus 200 is performed according to an instruction from a transmission/reception indicator 406 which is also one function of the CPU 401.

The CPU 401 further includes a determiner 407. The determiner 407 has a role of analyzing a relationship between a table stored in the storage device 403 and the temperature information measured by the second temperature measurement device 237.

A network transmitter/receiver 283 connected to a host device 270 via a network is installed. The network transmitter/receiver can receive information or the like which relates to a processing history or a processing schedule of the substrate 100 in the lot.

The storage device 403 includes, for example, a flash memory, a hard disk drive (HDD), or the like. Process recipes 409 in which procedures or conditions of the substrate processing are described and a control program 410 for controlling the operation of the substrate processing apparatus are readably stored in the storage device 403. The storage device 403 includes a temperature storage device 411 capable of recording temperature data measured by the temperature measurement devices 221 and 237 or reading/writing the temperature data.

The process recipes are combined to obtain a predetermined result by causing the controller 400 to execute respective procedures in the substrate-processing process to be described later, and function as a program. Hereinafter, the process recipes and the control program are collectively referred to simply as a program. In the present disclosure, the term "program" may include only a process recipe, only a control program, or both. Further, the RAM 402 is configured as a memory area (work area) in which programs, data or the like read/written by the CPU 401 are temporarily held.

The I/O port 404 is connected to each components of the PM, such as the gate valve 149, the elevator 218, the pressure regulators, pumps, the heater controller 223, or the like.

The CPU 401 is configured to read/write and execute the control program from the storage device 403 and to read/write the process recipes from the storage device 403 in response to an input of an operation command from an input/output device 281. Then, the CPU 401 can control the opening/closing operation of the gate valve 149, the operation of the elevator 218, the temperature measurement devices 221 and 237, the heater controller 223, on/off control of the pumps, the flow rate adjusting operation of the mass flow controllers, the valves, and so on according to contents of the read/written process recipes.

The controller 400 according to the present technique can be configured by installing the program in a computer using an external storage device 282 (for example, a magnetic disk such as a hard disk, an optical disk such as a DVD, a magneto-optical disk such as an MO, or a semiconductor memory such as a USB memory) storing the above-mentioned program, or the like. The means for supplying the program to the computer is not limited to being supplied via the external storage device 282. For example, a communication means such as Internet or a dedicated line may be used to supply the program without going through the external storage device 282. Further, the storage device 403 and the external storage device 282 are configured as a computer-readable recording medium. Hereinafter, these are collectively referred to simply as a recording medium. In the present disclosure, when the term "recording medium" is used, it may include the storage device 403 alone, the external storage device 282 alone, or both.

(2) Substrate-Processing Process

Figure 8:
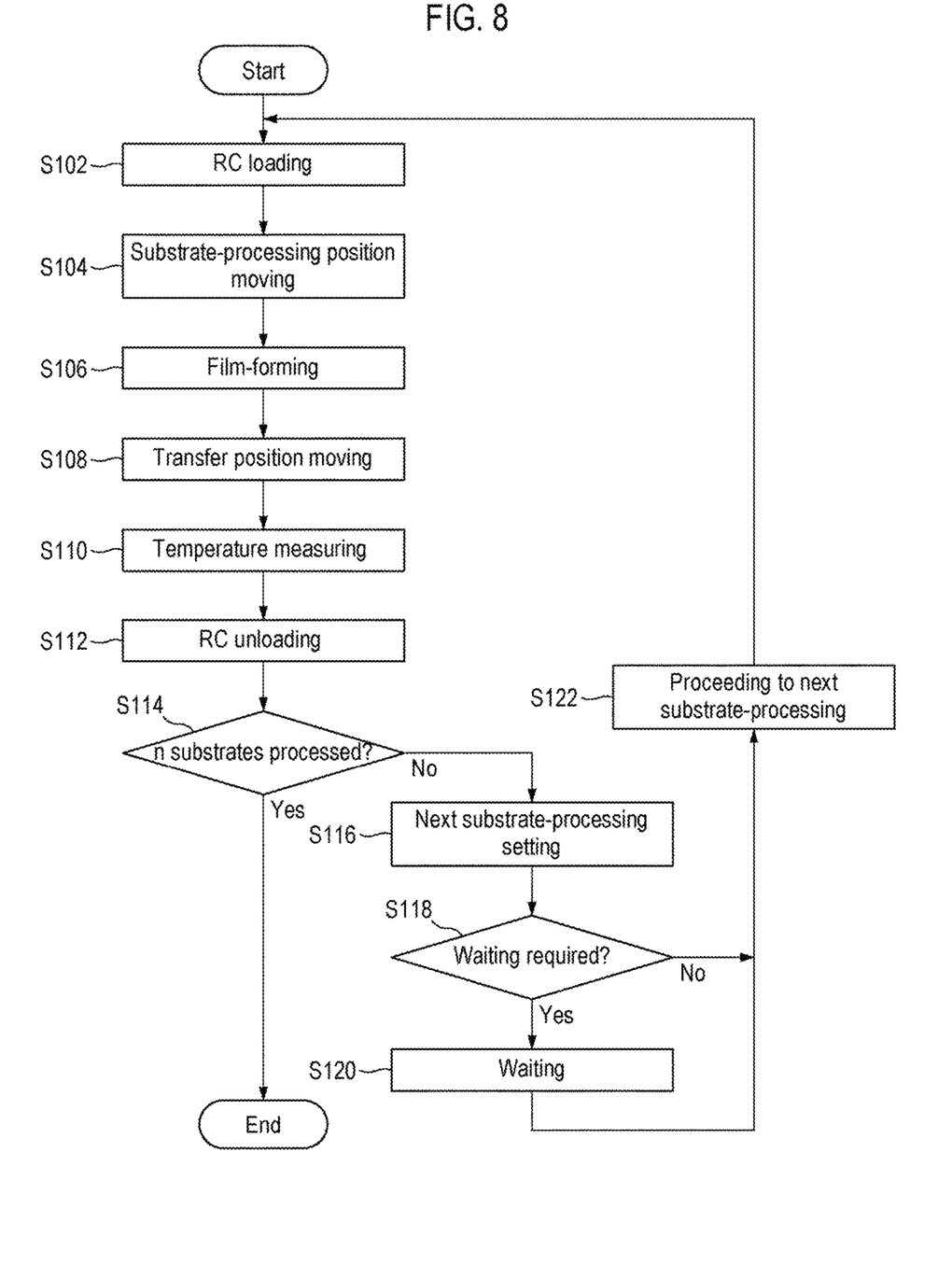
FIG. 8 is a flowchart for explaining a substrate-processing process according to one or more embodiments.

Next, as one process of semiconductor-manufacturing processes, a process of forming a film on the substrate 100 using the substrate processing apparatus 200 as configured above will be described with reference to FIG. 8. In the following description, the controller 400 controls the operations of various components of the substrate processing apparatus.

In the following description, n indicates the number of substrates 100 to be processed in one lot, and m indicates a substrate number of a substrate 100 to be processed in the lot. For example, if m=1, it is the first substrate, and if m is 10, it is the tenth substrate. Since m is the substrate number in the lot, m=1, 2, . . . , n.

Here, a substrate-processing method in one RC will be described as an example.

(Substrate Transferring)

A substrate transferring will be described. Note that FIG. 8 omits this operation. In the substrate transferring, a substrate 100 is unloaded from the pod 111. Here, for example, an arbitrary m-th substrate 100 is unloaded from the pod 111.

The substrate 100 is mounted on the mounting surface 135 of the load lock chamber 130 via the atmosphere transfer chamber 120.

Thereafter, the m-th substrate 100 is picked up by the robot 170 and waits in the vacuum transfer chamber 140.
(RC Loading S102)

An RC substrate loading S102 will be described. Here, the substrate 100 waiting in the vacuum transfer chamber 140 is loaded into the RC.

Specifically, the substrate-mounting table 212 is lowered to the transfer position P0 of the substrate 100, and the lift pins 207 are passed through the through-holes 214 of the substrate-mounting table 212. As a result, the lift pins 207 project from the surface of the substrate-mounting table 212 by a predetermined height. Simultaneously with these operations, the atmosphere of the transfer chamber 206 is exhausted to have the same pressure as the pressure of the adjacent vacuum transfer chamber 140 or a pressure lower than the pressure of the adjacent vacuum transfer chamber 140.

Subsequently, the gate valve 149 is opened to make the transfer chamber 206 communicate with the adjacent vacuum transfer chamber 140. Then, the vacuum transfer robot 170 loads the substrate 100 from the vacuum transfer chamber 140 into the transfer chamber 206 and places the substrate 100 on the lift pins 207.
(Substrate-Processing Position Moving S104)

A substrate-processing position moving S104 will be described. When the substrate 100 is placed on the lift pins 207, the substrate-mounting table 212 is raised, the substrate 100 is mounted on the substrate-mounting surface 211, and the substrate-mounting table 212 is further raised to the substrate-processing position as illustrated in FIG. 3.
(Film-Forming S106)

Subsequently, a film-forming S106 will be described. When the substrate-mounting table 212 moves to the substrate-processing position, the atmosphere of the process chamber 201 is exhausted through the exhaust pipe 272 to adjust the internal pressure of the process chamber 201.

Here, the substrate 100 is heated by the heater 213 while being mounted on the substrate-mounting surface 211. When the temperature of the substrate 100 reaches a predetermined temperature, for example, a range from 400 degrees C. to 600 degrees C. while adjusting the internal pressure of the process chamber 201 to a predetermined pressure, process gas, for example, $TiCl_4$ gas and ammonia gas, is supplied from the gas supplier into the process chamber. A titanium-containing film is formed on the substrate 100 by the supplied $TiCl_4$ gas and ammonia gas. The substrate 100 is processed until the titanium-containing film has a desired thickness.
(Transfer Position Moving S108)

Subsequently, a transfer position moving S108 will be described. When a film having a desired thickness is formed, the substrate-mounting table 212 is moved down to the transfer position P0 illustrated in FIG. 3. Therefore, the substrate 100 waits in the transfer chamber 206.
(Temperature Measuring S110)

Subsequently, a temperature measuring S110 will be described. In the temperature measuring S110, the temperature measuring device 235 measures the temperature of the process chamber 201. For example, the temperature of the buffer structure 230 is measured as the temperature of the process chamber 201. Specifically, the temperature measuring device 235 measures the temperature of the lid 231. The temperature measurement device 237 records the temperature data measured by the temperature measuring device 235 in the temperature storage device 411.

By measuring the temperature after the film-forming S106, it is possible to find the temperature of the process chamber 201 which has risen until the film-forming S106 is completed. Therefore, the temperature may be measured after the film-forming S106.

Here, the temperature was measured after the transfer position moving S108, but the present disclosure is not limited thereto. If the temperature of the process chamber 201 after the film-forming S106 can be found, the temperature may be detected during the transfer position moving S108.
(RC Unloading S112)

Subsequently, a substrate unloading S112 will be described. When the substrate 100 is moved to the transfer position P0, the gate valve 149 is opened, and the substrate 100 is unloaded from the transfer chamber 206 to the vacuum transfer chamber 140.
(Determination S114)

Subsequently, a determination S114 will be described. When the film-forming S106 and the temperature measuring S110 are completed, the process proceeds to the determination S114. Here, after processing a predetermined number of substrates 100, it is determined whether there is a substrate to be processed next. When it is determined that all the substrates in one lot, that is, the n substrates, including the substrates processed by other RCs, have been processed, the process ends. Alternatively, even if all the n substrates have not been processed, the process ends if there is no substrate 100 to be processed next. If there is a substrate to be processed next, the process proceeds to the next substrate-processing setting S116.
(Next Substrate-Processing Setting S116)

Subsequently, the next substrate-processing setting S116 will be described. Here, the substrate processing apparatus 200 is set to deal with a substrate 100 to be processed next. For example, if the m-th substrate has been processed, the substrate processing apparatus 200 is set so that the substrate 100 to be processed next can be processed. As an example of the setting, switching is performed so that the atmosphere transfer robot 122 can access the substrate 100 to be processed next.

Since this operation is performed after the m-th substrate 100 is unloaded from the PM, the substrate-mounting table 212 is in a state of waiting at the transfer position P0.
(Determination S118)

A determination S118 will be described. Here, before mounting the substrate 100 to be processed next on the substrate-mounting table 212, it is determined whether or not processing in the process chamber 201 waits for a predetermined time. Specifically, it is determined whether or not the substrate-mounting table 212 is to wait at the transfer position P0 for a predetermined time without supplying a gas into the process chamber 201. The criteria for the determination will be described later.

Next, reasons for waiting for a predetermined time will be described. During the film-forming S106, the heater 213 heats not only the substrate 100 but also the process chamber 201. Therefore, heat is accumulated in the process chamber 201 during the film-forming S106, and the temperature of the process chamber 201 becomes higher than the temperature of the process chamber 201 at the start of the film-forming S106.

In general, it is known that the temperature of the substrate 100 is affected not only by the heater 213 but also by other surrounding structures (for example, the process chamber 201). Therefore, the next substrate processing is affected by the process chamber 201 heated in the previous substrate processing.

Figure 9:
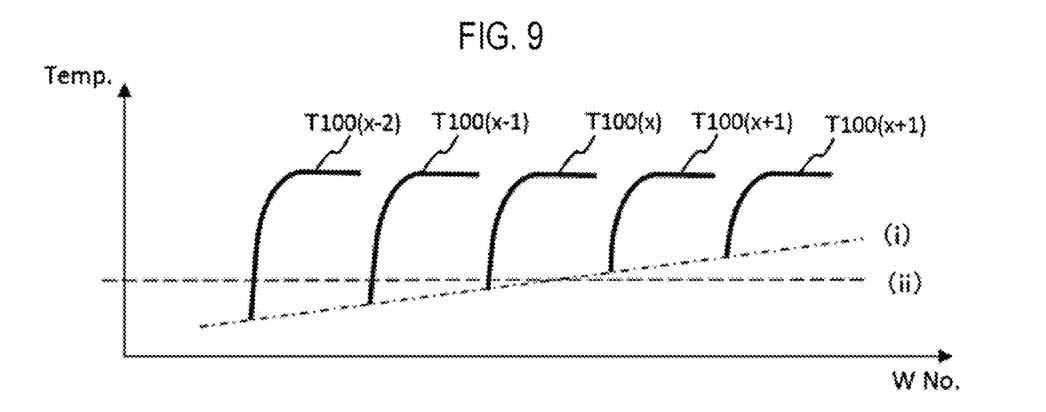
FIG. 9 is an explanatory view for explaining a relationship between a substrate temperature and the number of processed substrates according to one or more embodiments.

This will be described with reference to FIG. 9. FIG. 9 illustrates the relationship between the substrate 100 which is continuously processed and the substrate temperature. The horizontal axis indicates a processed substrate (100) number, and the vertical axis indicates the temperature of the substrate 100. The number 100(*x*) on the horizontal axis indicates the x-th substrate 100 processed in the RC. Note that x is an arbitrary number.

A line T100(*x*) indicates the temperature of the substrate 100(*x*) in S106. A line T100(*x*−2) indicates the temperature of a substrate 100(*x*−2), processed two times before as viewed from x, in S106. A line T100(*x*+2) indicates the temperature of a substrate 100(*x*+2), processed two times after as viewed from x, in S106. The same applies to a line T100(*x*−1) and a line T100(*x*+1). A line (i) is a line connecting initial process temperatures of the respective substrates 100.

The temperature of each substrate 100 is gradually increased from the start of the film-forming S106, and thereafter, is maintained at a predetermined temperature. During this operation, a gas is supplied onto the substrate 100 to form a desired film.

As described above, since the temperature of the process chamber 201 increases each time the processing is performed, the substrate to be processed next is loaded in a state where the temperature of the process chamber 201 is high. For example, the initial process temperature of the substrate 100(*x*−1) which is loaded next to the substrate 100(*x*−2) becomes higher than the initial process temperature of the substrate 100(*x*−2) which is previously processed. Therefore, when the substrate 100 is continuously processed, the initial process temperature of the substrate 100 gradually increases as indicated by the line (i).

Figure 10A:
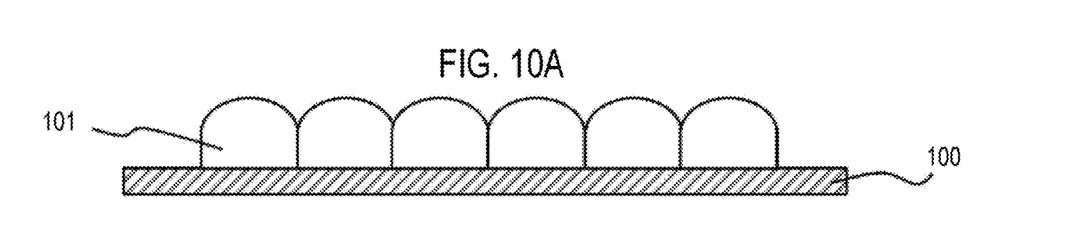
FIGS. 10A and 10B are explanatory diagrams for explaining a grain size of a film formed on a substrate according to one or more embodiments.
Figure 10B:
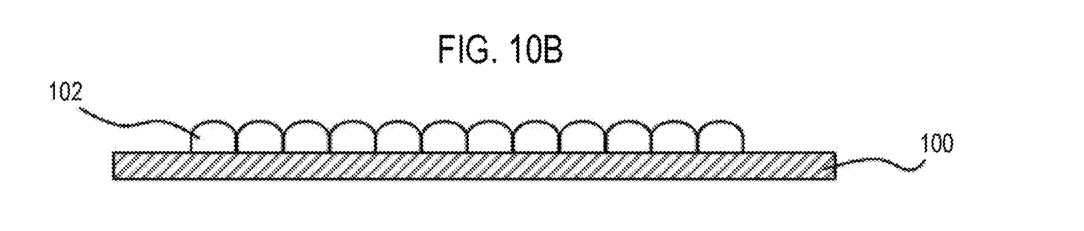

In such a situation, inventors have conducted intensive researches and found that the film quality is changed depending on the initial process temperature of the substrates 100. For example, when the processing is performed at a low temperature, as illustrated in FIG. 10A, a size of a crystal 101 of a film component first deposited on the substrate 100 is large. On the other hand, when the processing is performed at a high temperature, as illustrated in FIG. 10B, a size of a crystal 102 of the film component first deposited on the substrate 100 is small.

Furthermore, the inventors have found that the size of the crystal (hereinafter referred to as a grain size) is inversely proportional to a resistance value of the film. Specifically, a larger grain size provides a smaller resistance value, whereas a smaller grain size provides a larger resistance value. This is thought to be due to a dependence on a film composition density.

Such a variation in resistance value between substrates leads to variation in quality of semiconductor products. That is, the yield is reduced. In particular, in recent highly-integrated semiconductor products, the influence of variations in resistance values of insulating films, metal films, or the like is more remarkable. Therefore, it is desirable to keep the quality of each substrate 100 constant. Here, the initial process temperature of the substrate is controlled by performing the waiting S120 to be described later, and the grain size of the substrate is controlled to be equal to or larger than a predetermined size.

Next, a specific operation of the determination S118 will be described. Here, if the processing is started at a predetermined temperature or lower for the substrate 100 loaded into the process chamber 201, it is determined to be "No," and the process proceeds to the proceeding to next substrate-processing S122. If the processing is started at a temperature higher than the predetermined temperature, it is determined to be "Yes," and the process proceeds to the waiting S120. The predetermined temperature indicates, for example, a temperature at which the grain size becomes larger than the predetermined size.

In FIG. 9, a predetermined temperature indicated by a line (ii) is a reference temperature at which a grain size equal to or larger than a predetermined size is formed. Specifically, the grain sizes of the substrates 100(*x*−2), 100(*x*−1), and 100(*x*) whose initial process temperatures are equal to or lower than the reference temperature can be equal to or larger than a predetermined size. Since the initial process temperatures of the substrates 100(*x*+1) and 100(*x*+2) are higher than the reference temperature, the grain sizes thereof are smaller than the predetermined size.

As described above, the initial process temperature of the substrate 100 is affected by the temperature of the process chamber 201 once the previous substrate has processed. Therefore, in this operation, the determiner 407 makes a determination by comparing the temperature of the process chamber 201 recorded in the temperature storage device 411 with a predetermined temperature. The temperature recorded in the temperature storage device 411 is the temperature measured in the temperature measuring S110.

Here, the temperature measured in the temperature measuring S110 is compared with the predetermined temperature, but the present disclosure is not limited thereto and may make another determination as follows. For example, in a factory or the like that manufactures the present apparatus, the number of processed substrates in which the temperature of the process chamber 201 becomes higher than a predetermined temperature may be verified, and a determination may be made based on whether or not the number of processed substrates has been processed. In this case, the number of substrates one before the number of substrates reaching the predetermined temperature is set as a threshold value, and it is determined whether the threshold value has been reached or not. When the threshold value has been reached, the process proceeds to the waiting S120. When the threshold value has not yet been reached, the process proceeds to the proceeding to next substrate-processing S122.

(Waiting S120)

Subsequently, the waiting S120 will be described. When it is determined to be "Yes" in the determination S118, the process proceeds to the waiting S120. In the waiting S120, the processing such as gas supply, heating, or the like performed in the film-forming S106 is stopped with the gate valve 149 closed. Further, the substrate 100 has been unloaded and the substrate-mounting table 212 is maintained at the transfer position P0. That is, the heater 213 is kept retracted from the process chamber 201. In this state, each component waits for a predetermined time.

Since the heater 213 is retracted from the process chamber 201 during the waiting, the influence of the heater 213 on the process chamber 201 is reduced to lower the temperature of the process chamber 201. Here, the process waits for a predetermined time so that the initial process temperature of the substrate 100 to be loaded next becomes equal to or lower than the reference temperature.

When the waiting is started and a predetermined time has elapsed, the waiting S120 is completed, and the process proceeds to the proceeding to next substrate-processing S122.

More specifically, in the waiting S120, cooling gas may be supplied from the third gas supplier. When the cooling gas is supplied, the process chamber 201 can be cooled faster, so that the waiting time can be reduced and the processing efficiency of the substrate can be increased.

(Proceeding to Next Substrate-Processing S122)

Subsequently, the proceeding to next substrate-processing S122 will be described. When the waiting S120 is completed, or when it is determined to be "No" in the determination S118, the process proceeds to the proceeding to next substrate-processing S122.

Here, the substrate processing apparatus 200 is controlled based on the setting of the next substrate-processing setting S116. For example, the vacuum transfer robot 170 or the like is controlled so that the next substrate 100 can be loaded into the PM.

In the above description, one RC is taken as an example, but the substrate 100 is similarly processed in other RCs. In these cases, the flow illustrated in FIG. 8 including the determination S118 is performed in each RC to control the temperature of the process chamber 201. That is to say, a plurality of process chambers is formed in a plurality of RCs, respectively, and whether to proceed to the act of waiting may be determined for each of the plurality of process chambers.

Here, the reason for performing the flow in each RC will be described. Although each RC includes a heater 213, there may be a variation in the heating state of the process chamber 201. For example, there may be a difference in the performance of the heater 213 or there may be a variation in the processing position. If a plurality of substrates 100 is continuously processed in each RC in a state where there are such machine differences, a difference in heat accumulation amount of the process chamber occurs. Since the heating state of the substrate 100 differs in each process chamber 201 as described above, the determination S118 may be performed for each RC.

By performing the determination S118 for each RC, the variation in the heating state of the RC can be reduced, and the grain size can be set to a predetermined size or more for all RCs. That is, the variation in the processing state of each of n substrates 100 in the lot is suppressed.

Other Embodiments

Although the embodiments have been specifically described above, the present technique is not limited to the above-described embodiments, but various modifications can be made without departing from the scope and spirit of the present disclosure.

For example, it has been illustrated in the film-forming performed by the substrate processing apparatus in each of the above-described embodiments that a film is formed by using the $TiCl_4$ gas as the first element-containing gas (first process gas) and the $NH_3$ gas as the second element-containing gas (second process gas). However, the present disclosure is not limited thereto, but another type of thin film may be formed by using another type of gas.

Although examples in which two types of gases are supplied are described here, the present disclosure is not limited to these examples, but one type of gas or three or more types of gases may be supplied to form a film.

According to the present disclosure in some embodiments, it is possible to form a film having a desired quality in a substrate processing apparatus that continuously heats a plurality of substrates.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, which processes n substrates as one lot, comprising:
   loading an m-th substrate into a process chamber, wherein m is an integer less than n;
   forming a film having a grain size on the m-th substrate by heating the m-th substrate in the process chamber;
   unloading the m-th substrate from the process chamber;
   waiting for a predetermined time in the process chamber until a temperature of the process chamber becomes equal to or lower than a reference temperature at which a grain size of a film is equal to or larger than a predetermined size, in a state where the substrates are not present in the process chamber, after the act of unloading;
   loading a next substrate, which is one of the n substrates to be processed next, into the process chamber, after the act of waiting; and
   forming a film having the grain size that is equal to or larger than the predetermined size on the next substrate by heating the next substrate in the process chamber.

2. The method of claim 1, wherein in the act of forming the film, the substrate is heated by a heater of a substrate-mounting table, and
   wherein in the act of waiting, the substrate-mounting table is retracted from the process chamber.

3. The method of claim 2, wherein the act of waiting is performed after the act of forming the film is repeated for a predetermined number of substrates.

4. The method of claim 2, wherein the act of waiting is performed when a temperature of the process chamber exceeds the reference temperature.

5. The method of claim 2, wherein the process chamber is cooled during the act of waiting.

6. The method of claim 2, wherein the process chamber is installed in a plural number, and
   wherein whether to proceed to the act of waiting is determined for each of the plural number of process chambers.

7. The method of claim 1, wherein the act of waiting is performed after the act of forming the film is repeated for a predetermined number of substrates.

8. The method of claim 7, wherein the process chamber is cooled during the act of waiting.

9. The method of claim 7, wherein the process chamber is installed in a plural number, and
   wherein whether to proceed to the act of waiting is determined for each of the plural number of process chambers.

10. The method of claim 1, wherein the act of waiting is performed when a temperature of the process chamber exceeds the reference temperature.

11. The method of claim 10, wherein the process chamber is cooled during the act of waiting.

12. The method of claim 1, wherein the process chamber is cooled during the act of waiting.

13. The method of claim 12, wherein a heat conductive gas is supplied into the process chamber during the act of waiting.

14. The method of claim 1, wherein the process chamber is installed in a plural number, and
wherein whether to proceed to the act of waiting is determined for each of the plural number of process chambers.

15. A substrate processing apparatus configured to be capable of performing the method of claim 1.

16. A method of processing a substrate that processes n substrates as one lot, comprising:
loading an m-th substrate into a process chamber, wherein m is an integer less than n;
forming a film having a grain size on the m-th substrate by heating the m-th substrate in the process chamber;
unloading the m-th substrate from the process chamber;
waiting for a predetermined time in the process chamber, until a temperature of the process chamber becomes equal to or lower than a reference temperature at which a grain size of a film is equal to or larger than a predetermined size, in a state where the substrates are not present in the process chamber, after the act of unloading;
loading a next substrate, which is one of the n substrates to be processed next, into the process chamber, after the act of waiting; and
forming a film having the grain size that is equal to or larger than the predetermined size on the next substrate by heating the next substrate in the process chamber.

17. A non-transitory computer-readable recording medium storing a program that causes, by a computer, a substrate processing apparatus to perform the method of claim 16.

* * * * *